US011508739B2

(12) United States Patent
Huang et al.

(10) Patent No.: US 11,508,739 B2
(45) Date of Patent: Nov. 22, 2022

(54) METHOD OF MANUFACTURING MEMORY STRUCTURE (71) Applicant: Powerchip Semiconductor Manufacturing Corporation, Hsinchu (TW)

(72) Inventors: Hui-Chin Huang, Hsinchu (TW); Kai-Yao Shih, Hsinchu (TW); Yu-Mei Liao, Hsinchu County (TW); Hsin-Yi Liao, Hsinchu (TW)

(73) Assignee: Powerchip Semiconductor Manufacturing Corporation, Hsinchu (TW)

( * ) Notice: Subject to any disclaimer, the term of this patent is extended or adjusted under 35 U.S.C. 154(b) by 360 days.

(21) Appl. No.: 16/880,937

(22) Filed: May 21, 2020

(65) Prior Publication Data
US 2021/0320113 A1 Oct. 14, 2021

(30) Foreign Application Priority Data
Apr. 13, 2020 (TW) .................................. 109112336

(51) Int. Cl.
*H01L 27/11517* (2017.01)
*H01L 27/11563* (2017.01)
(Continued)

(52) U.S. Cl.
CPC .. *H01L 27/11517* (2013.01); *H01L 21/76224* (2013.01); *H01L 27/11563* (2013.01); *H01L 27/11539* (2013.01)

(58) Field of Classification Search
CPC ........ H01L 27/11517–11534; H01L 27/11563; H01L 21/76224; H01L 21/76229; H01L 21/76232
See application file for complete search history.

(56) References Cited

U.S. PATENT DOCUMENTS

| 7,183,615 B2 | 2/2007 | Yamashita et al. |
| 2007/0111433 A1 | 5/2007 | Hirasawa et al. |
| 2018/0151580 A1* | 5/2018 | Wu .................... H01L 29/42376 |

FOREIGN PATENT DOCUMENTS

TW          201947743          12/2019

OTHER PUBLICATIONS

Jeng-Hwa Liao, et al. "Robust Shallow Trench Isolation Technique Used for 75nm NOR Flash Memory", IEEE ASMC, Jul. 11-13, 2010, pp. 260-263.

(Continued)

*Primary Examiner* — Tucker J Wright
(74) *Attorney, Agent, or Firm* — JCIPRNET (57) ABSTRACT

A method of manufacturing a memory structure including the following steps is provided. A first pad layer is formed on a substrate. Isolation structures are formed in the first pad layer and the substrate. At least one shape modification treatment is performed on the isolation structures. Each shape modification treatment includes the following steps. A first etching process is performed on the first pad layer to reduce a height of the first pad layer and to form first openings exposing sidewalls of the isolation structures. After the first etching process is performed, a second etching process is performed on the isolation structures to modify shapes of the sidewalls of the isolation structures exposed by the first openings. The first pad layer is removed to form a second opening between two adjacent isolation structures.

20 Claims, 12 Drawing Sheets

(51) Int. Cl.
*H01L 21/762* (2006.01)
*H01L 27/11539* (2017.01)

(56) References Cited

OTHER PUBLICATIONS

"Office Action of Taiwan Counterpart Application", dated Feb. 19, 2021, p. 1-p. 6.

* cited by examiner

METHOD OF MANUFACTURING MEMORY STRUCTURE

CROSS-REFERENCE TO RELATED APPLICATION

This application claims the priority benefit of Taiwan application no. 109112336, filed on Apr. 13, 2020. The entirety of the above-mentioned patent application is hereby incorporated by reference herein and made a part of this specification.

BACKGROUND OF THE INVENTION

Field of the Invention

The invention relates to a method of manufacturing a semiconductor structure, and in particular to a method of manufacturing a memory structure.

Description of Related Art

At present, in the manufacturing process of some memory devices, a charge-storage layer is formed in an opening between two adjacent isolation structures. However, when the width of the top of the opening between two adjacent isolation structures is too small, the gap-fill capability of the charge-storage layer is worsened. In addition, when the width of the top of the opening between two adjacent isolation structures is too small, the isolation structures produce a shadowing effect on the ion implantation process during the ion implantation process performed on a substrate below the opening. Therefore, the quality of the doped regions formed by the ion implantation process is poor.

SUMMARY OF THE INVENTION

The invention provides a method of manufacturing a memory structure that may improve the gap-fill capability of a charge-storage layer and may reduce the shielding effect on an ion implantation process.

The invention provides a manufacturing method of a memory structure including the following steps. A first pad layer is formed on a substrate. Isolation structures are formed in the first pad layer and the substrate. At least one shape modification treatment is performed on the isolation structures. Each shape modification process includes the following steps. A first etching process is performed on the first pad layer to reduce a height of the first pad layer and to form first openings exposing sidewalls of the isolation structures. After the first etching process is performed, a second etching process is performed on the isolation structures to modify shapes of the sidewalls of the isolation structures exposed by the first openings. The first pad layer is removed to form a second opening between two adjacent isolation structures.

According to an embodiment of the invention, in the method of manufacturing the memory structure, a method of forming the isolation structures may include the following steps. A patterning process is performed on the first pad layer and the substrate to form a plurality of trenches in the first pad layer and the substrate. An isolation structure material layer filled in the trenches is formed. The isolation structure material layer outside the trenches is removed.

According to an embodiment of the invention, in the method of manufacturing the memory structure, after the patterning process is performed on the first pad layer, an angle between a bottom surface of the first pad layer and sidewalls of the first pad layer may be less than 86 degrees.

According to an embodiment of the invention, in the method of manufacturing the memory structure, a method of forming the isolation structure material layer is, for example, a high aspect ratio process (HARP) or high-density plasma chemical vapor deposition (HDPCVD).

According to an embodiment of the invention, in the method of manufacturing the memory structure, the first etching process is, for example, a wet etching process. A method of removing the first pad layer is, for example, a wet etching method.

According to an embodiment of the invention, in the method of manufacturing the memory structure, a material of the first pad layer is, for example, silicon nitride. An etchant used in the first etching process may include a phosphoric acid. An etchant used to remove the first pad layer may include a phosphoric acid. A temperature of the phosphoric acid used to remove the first pad layer may be higher than a temperature of the phosphoric acid used in the first etching process.

According to an embodiment of the invention, in the method of manufacturing the memory structure, a top width of the first openings may be enlarged by the second etching process.

According to an embodiment of the invention, in the method of manufacturing the memory structure, the second etching process is, for example, a wet etching process.

According to an embodiment of the invention, in the method of manufacturing the memory structure, a material of the isolation structures is, for example, silicon oxide. An etchant used in the second etching process may include diluted hydrofluoric acid (DHF).

According to an embodiment of the invention, in the method of manufacturing the memory structure, a total height of the first pad layer reduced by the shape modification treatment may be less than half of an initial height of the first pad layer.

According to an embodiment of the invention, in the method of manufacturing the memory structure, the following steps may be further included. A cleaning process is performed on the first pad layer before the shape modification treatment is performed.

According to an embodiment of the invention, in the method of manufacturing the memory structure, a cleaning solution used in the cleaning process may include diluted hydrofluoric acid.

According to an embodiment of the invention, in the method of manufacturing the memory structure, the following steps may be further included. A second pad layer is formed on the substrate before the first pad layer is formed. A material of the second pad layer is, for example, silicon oxide.

According to an embodiment of the invention, in the method of manufacturing the memory structure, the following steps may be further included. A doped region is formed in the substrate after the first pad layer is removed. The second pad layer is removed after the doped region is formed.

According to an embodiment of the invention, in the method of manufacturing the memory structure, a charge-storage layer may be further formed in the second openings.

According to an embodiment of the invention, in the method of manufacturing the memory structure, the charge-storage layer is, for example, a floating gate.

According to an embodiment of the invention, in the method of manufacturing the memory structure, a method of forming the charge-storage layer may include the following steps. A charge-storage material layer filled in the second openings is formed. The charge-storage material layer outside the second openings is removed.

According to an embodiment of the invention, in the method of manufacturing the memory structure, the following steps may be further included. A first dielectric layer is formed on the substrate exposed by the second openings before the charge-storage layer is formed.

According to an embodiment of the invention, in the method of manufacturing the memory structure, the following steps may be further included. A portion of the isolation structures is removed to form a plurality of third openings above the isolation structures. A second dielectric layer is formed on surfaces of the third openings and the charge-storage layer. A conductive layer is formed on the second dielectric layer. The conductive layer is filled in the third openings.

According to an embodiment of the invention, in the method of manufacturing the memory structure, the substrate may include a memory device region and a logic device region. The memory structure is located in the memory device region. The isolation structures in the memory device region and the isolation structures in the logic device region may be formed at the same time.

Based on the above, in the method of manufacturing the memory structure provided in the invention, a shape modification treatment is performed on the isolation structures to modify the sidewall shape of the isolation structures. As a result, the second openings have a larger top width. Since the second openings have a larger top width, the gap-fill capability of the charge-storage layer formed in the second openings may be improved. In addition, in the subsequent ion implantation process performed on the substrate below the second openings, the shielding effect of the isolation structures on the ion implantation process may be reduced.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

FIG. 1A to FIG. 1L are cross sections of a manufacturing process of a memory structure of an embodiment of the invention.

Figure 1A:
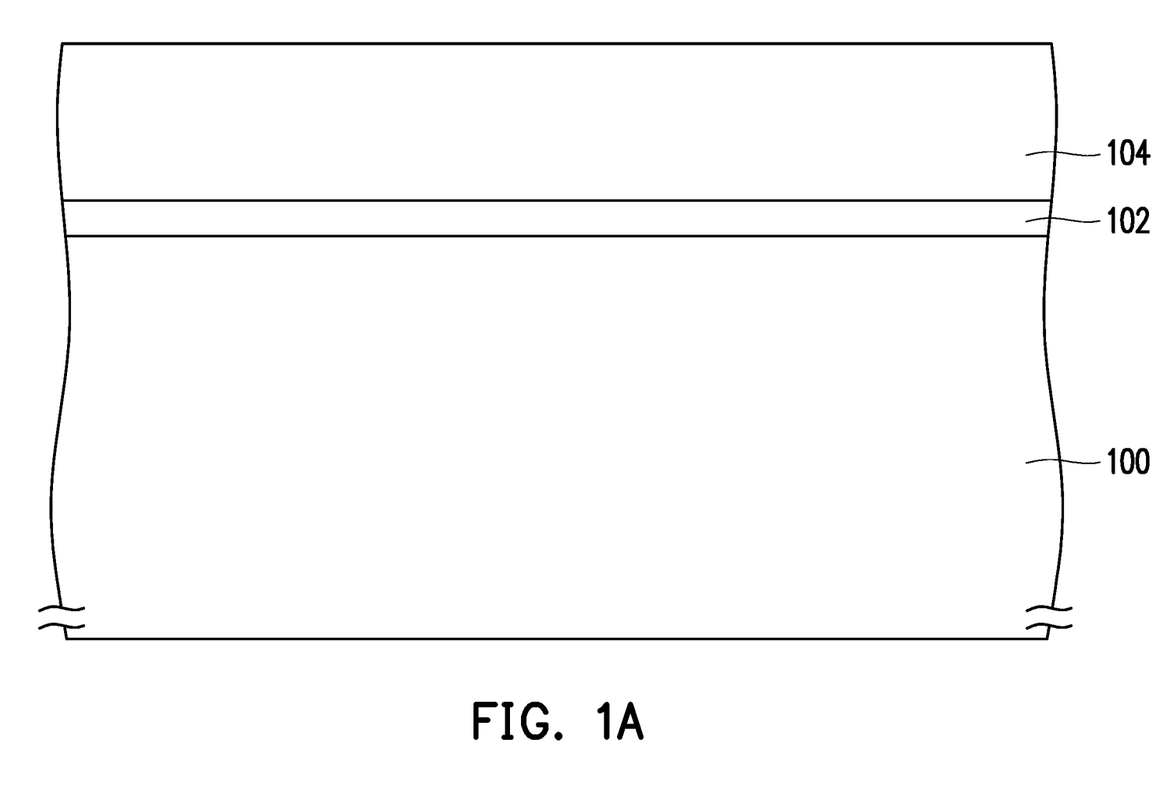
FIG. 1A to FIG. 1L are cross sections of a manufacturing process of a memory structure of an embodiment of the invention.

Referring to FIG. 1A, a pad layer 102 may be formed on a substrate 100. The substrate 100 may be a semiconductor substrate such as a silicon substrate. The material of the pad layer 102 is, for example, silicon oxide. The method of forming the pad layer 102 is, for example, a thermal oxidation method.

Next, a pad layer 104 may be formed on the pad layer 102. The material of the pad layer 104 is, for example, silicon nitride. The method of forming the pad layer 104 is, for example, a chemical vapor deposition method.

Figure 1B:
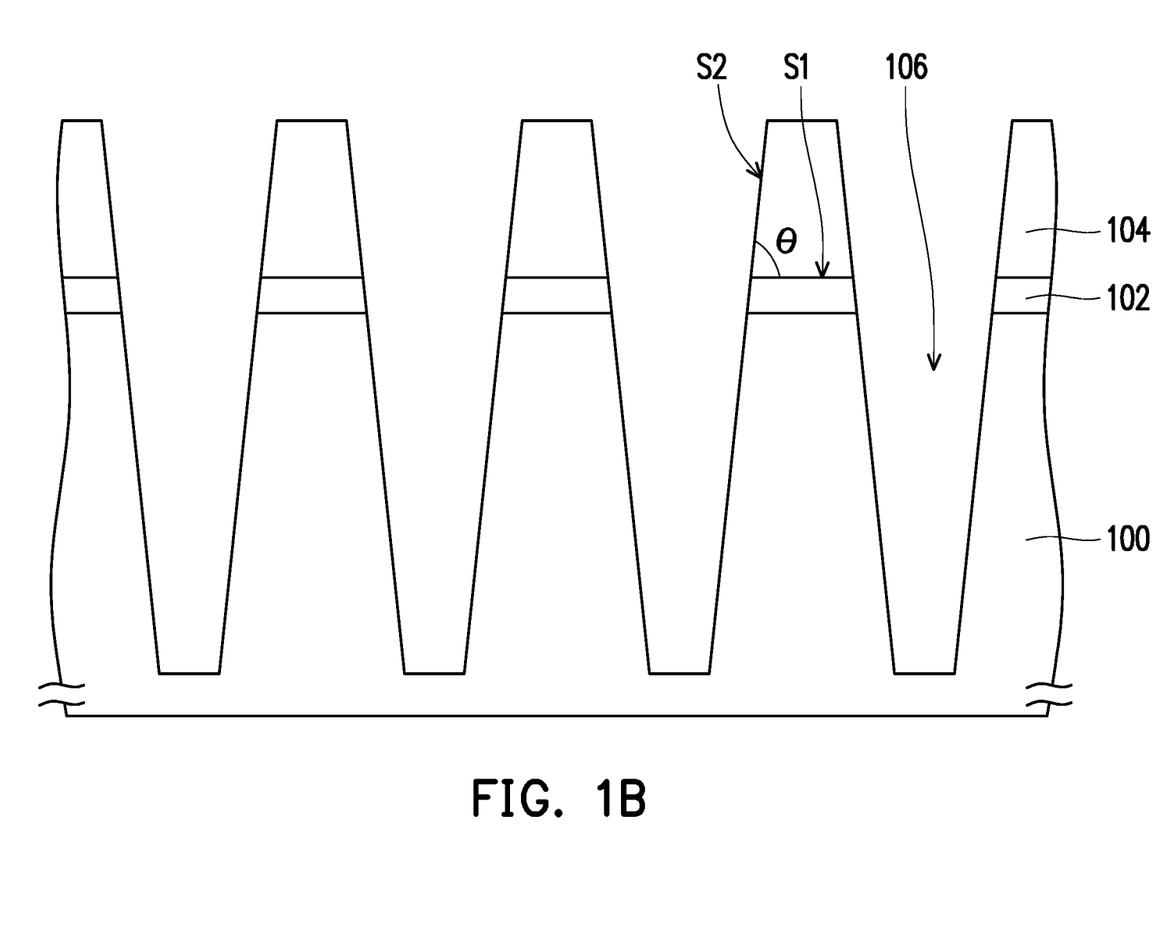

Referring to FIG. 1B, a patterning process is performed on the pad layer 104, the pad layer 102, and the substrate 100, and a plurality of trenches 106 are formed in the pad layer 104, the pad layer 102, and the substrate 100. For example, the pad layer 104, the pad layer 102, and the substrate 100 may be patterned via a lithography process and an etching process (e.g., dry etching process). In addition, after the patterning process is performed on the pad layer 104, an angle θ between a bottom surface S1 of the pad layer 104 and sidewalls S2 of the pad layer 104 may be less than 86 degrees, thereby improving the gap-fill capacity of the isolation structures subsequently formed in the trenches 106.

Figure 1C:
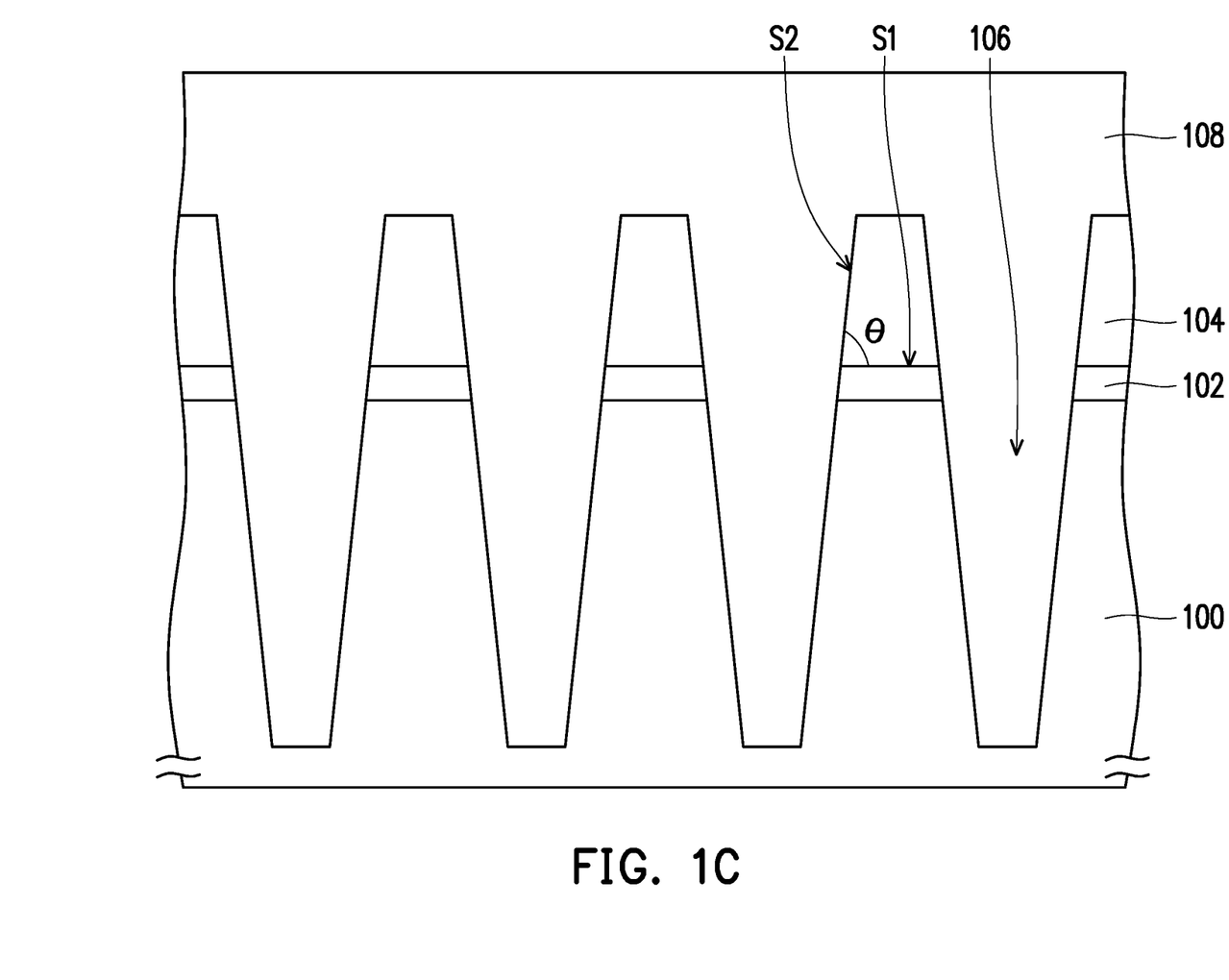

Referring to FIG. 1C, an isolation structure material layer 108 filled in the trenches 106 is formed. The material of the isolation structure material layer 108 is, for example, silicon oxide. The method of forming the isolation structure material layer 108 is, for example, a high aspect ratio process (HARP) or high-density plasma chemical vapor deposition (HDPCVD).

Figure 1D:
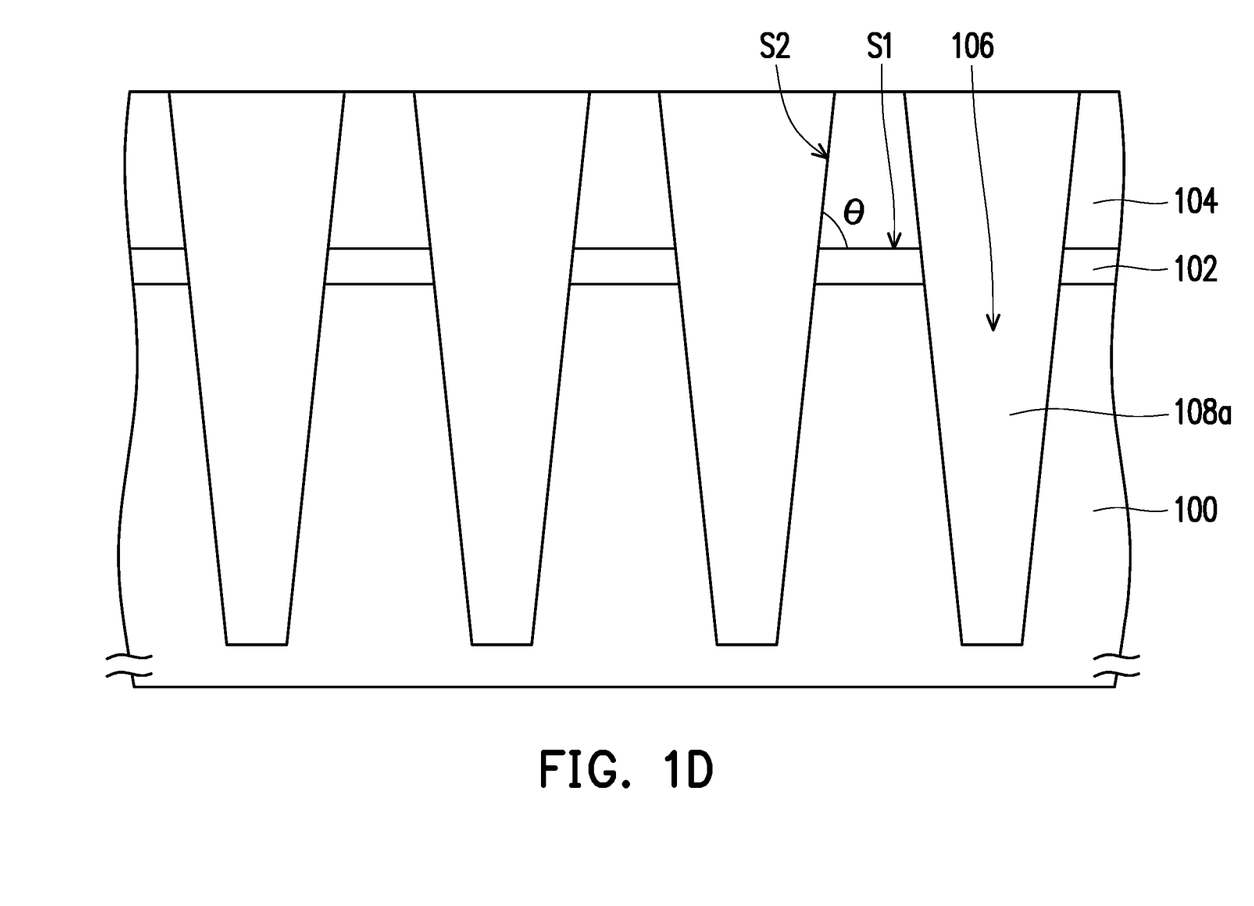

Referring to FIG. 1D, the isolation structure material layer 108 outside the trenches 106 is removed, and a plurality of isolation structures 108a are formed in the pad layer 104, the pad layer 102, and the substrate 100. The method of removing the isolation structure material layer 108 outside the trenches 106 is, for example, a chemical mechanical polishing method. In the present embodiment, the method of forming the isolation structures 108a is exemplified by the above method, but the invention is not limited thereto.

Figure 1E:
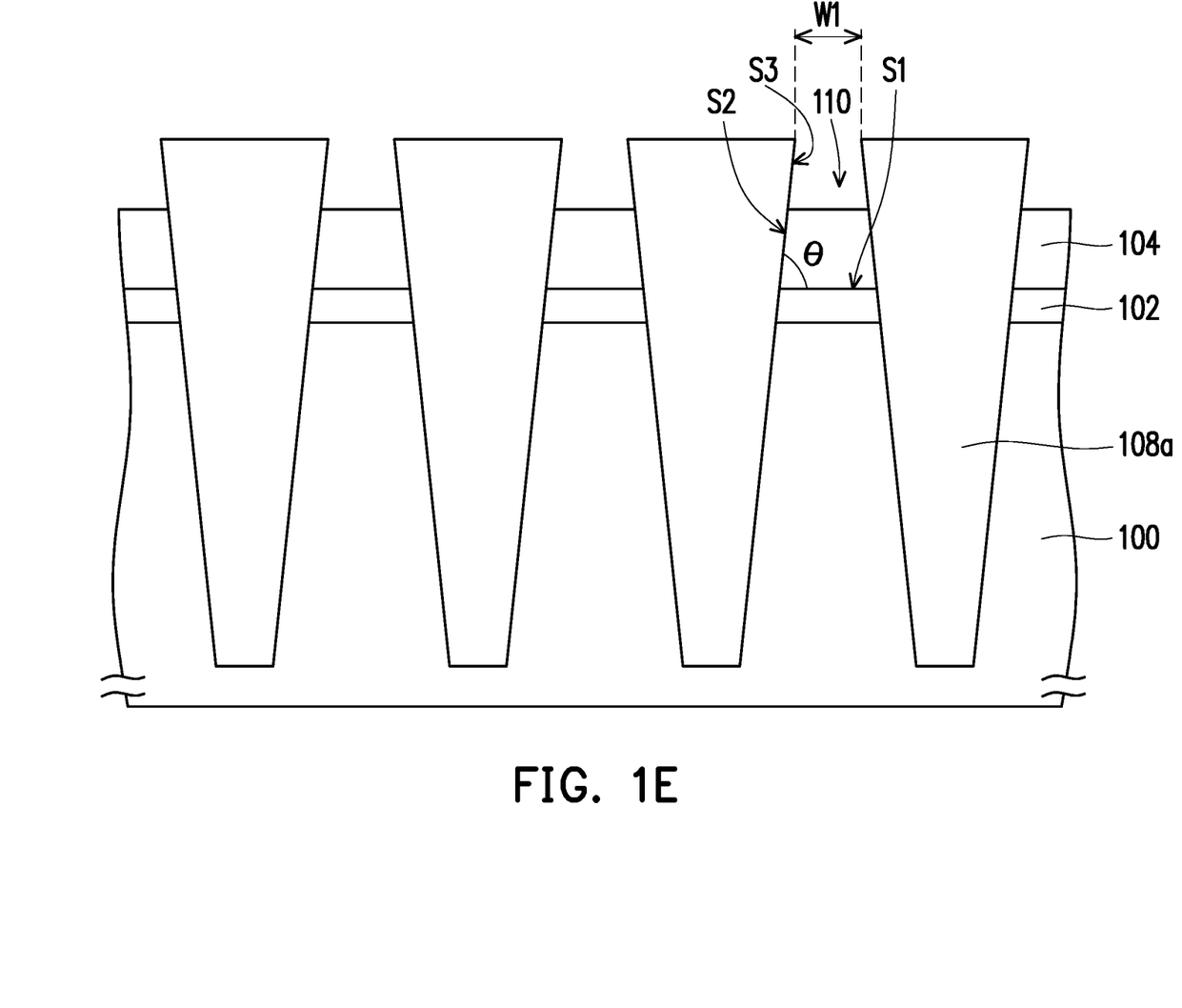
Figure 1F:
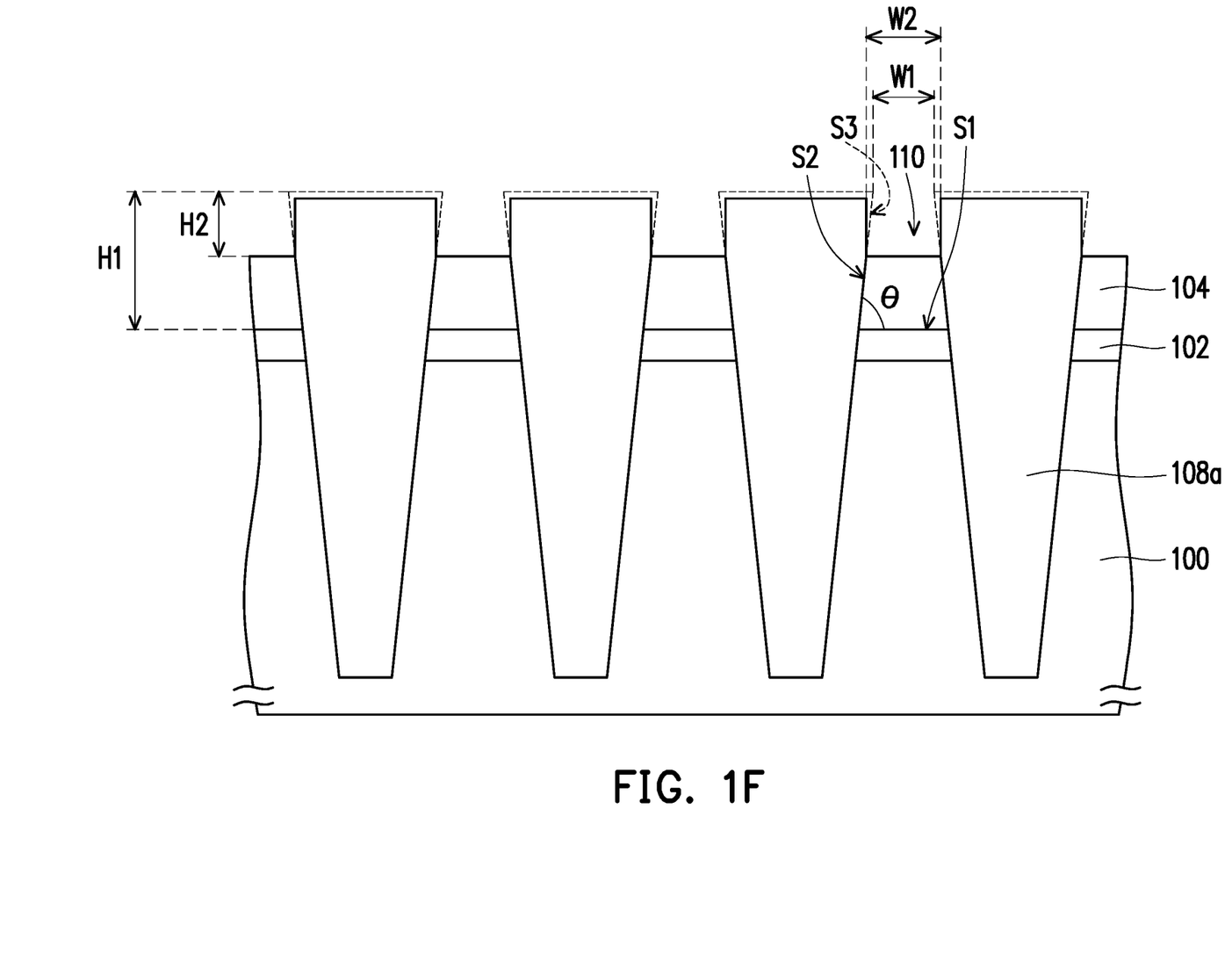

Referring to FIG. 1E and FIG. 1F, at least one shape modification treatment is performed on the isolation structures 108a. Each shape modification treatment includes performing the steps in FIG. 1E and FIG. 1F. In addition, before the shape modification treatment is performed, a cleaning process may be performed on the pad layer 104 to remove the native oxide (not shown) on the pad layer 104. The cleaning solution used in the cleaning process may include diluted hydrofluoric acid.

Referring to FIG. 1E, a first etching process is performed on the pad layer 104 to reduce the height of the pad layer 104 and form openings 110 exposing sidewalls S3 of the isolation structures 108a. The openings 110 may have a top width W1. The first etching process is, for example, a wet etching process. When the material of the pad layer 104 is silicon nitride and the first etching process is a wet etching process, the etchant used in the first etching process may include phosphoric acid.

Referring to FIG. 1F, after the first etching process is performed, a second etching process is performed on the isolation structures 108a to modify the shapes of the sidewalls S3 of the isolation structures 108a exposed by the openings 110. In this way, the top width of the openings 110 may be enlarged by the second etching process. For example, the top width of the openings 110 may be enlarged from the top width W1 (FIG. 1E) to a width W2 (FIG. 1F). The second etching process is, for example, a wet etching process. When the material of the isolation structures 108a is silicon oxide and the second etching process is a wet etching process, the etchant used in the second etching process may include diluted hydrofluoric acid. In the second etching process, in addition to removing a portion of the side of the isolation structures 108a to modify the shape of the sidewalls S3 of the isolation structures 108a exposed by the openings 110, a portion of the top of the isolation structures 108a may also be removed to reduce the height of the isolation structures 108a. In addition, since the pad layer 104 covers the pad layer 102, the second etching process does not cause loss to the pad layer 102.

In FIG. 1E and FIG. 1F, although the shape modification treatment is performed once on the isolation structures 108a as an example, the invention is not limited thereto. In other embodiments, a plurality of shape modification treatments may also be performed on the isolation structures 108a to obtain the desired sidewall shape of the isolation structures 108a. That is, as long as at least one shape modification treatment is performed on the isolation structures 108a, it falls within the scope of the invention. In addition, a total height H2 of the pad layer 104 reduced by at least one shape modification treatment may be less than half of an initial height H1 of the pad layer 104. In some embodiments, the total height H2 of the pad layer 104 reduced by the shape modification treatment may be one quarter to half of the initial height H1 of the pad layer 104. In some embodiments, the total height H2 of the pad layer 104 reduced by the shape modification treatment may be one third to half of the initial height H1 of the pad layer 104.

In addition, when a plurality of shape modification treatments are performed on the isolation structures 108a, a plurality of first etching processes and a plurality of second etching processes are performed. The amount of the pad layer 104 removed by each first etching process may be the same or different. The amount of the isolation structures 108a removed by each second etching process may be the same or different.

Figure 1G:
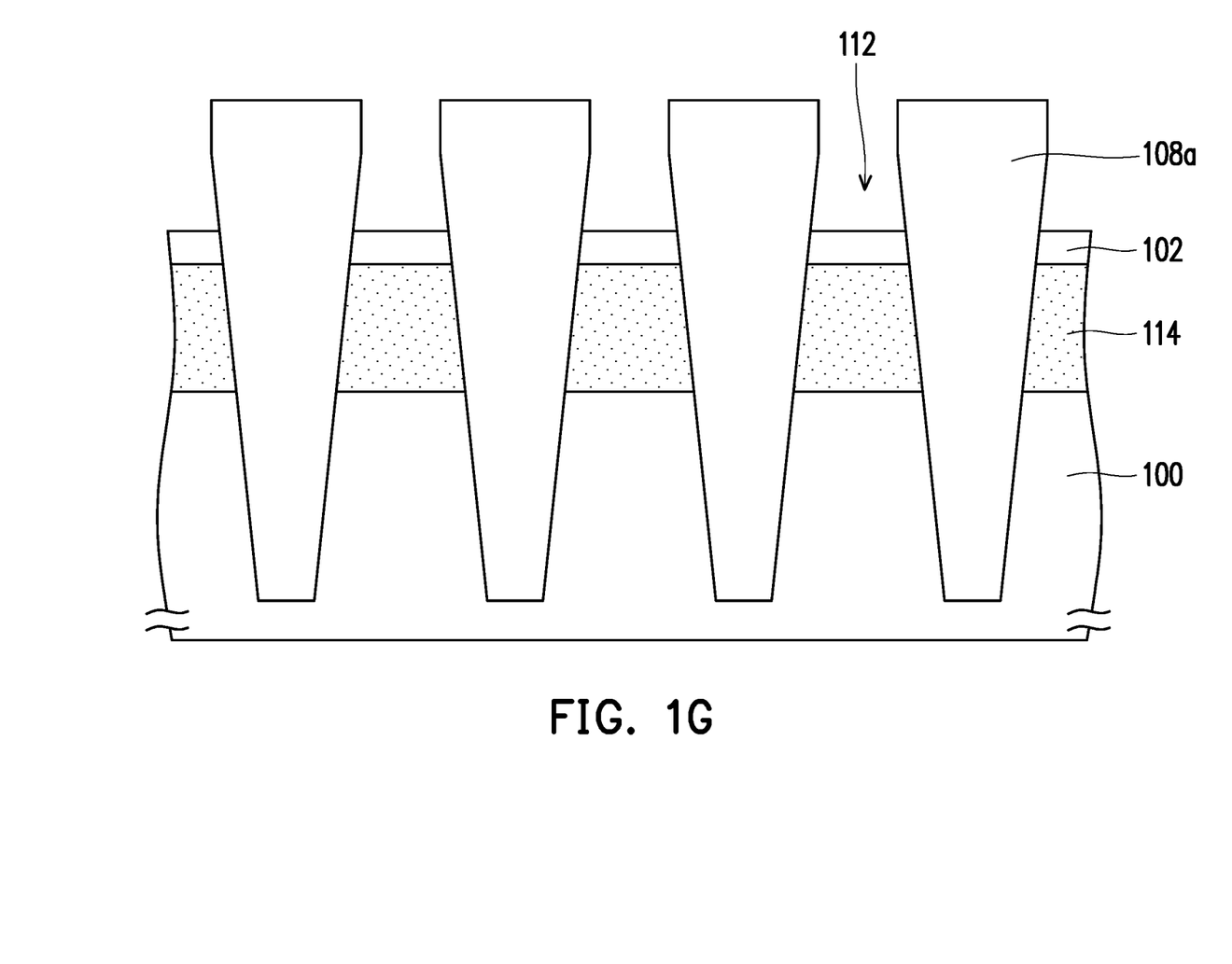

Referring to FIG. 1G, the pad layer 104 is removed, and an opening 112 is formed between two adjacent isolation structures 108a. The method of removing the pad layer 104 is, for example, a wet etching method. When the material of the pad layer 104 is silicon nitride, the etchant used in the wet etching method may include phosphoric acid. In addition, the etchant used to remove the first pad layer may include phosphoric acid. The temperature of the phosphoric acid used to remove the pad layer 104 may be higher than the temperature of the phosphoric acid used in the first etching process. For example, the temperature of the phosphoric acid used in the first etching process to reduce the height of the pad layer 104 may be 120° C. to 140° C., and the temperature of the phosphoric acid used to remove the pad layer 104 may be 150° C. to 170° C. In the first etching process for reducing the height of the pad layer 104, the use of phosphoric acid having a lower temperature may effectively control the amount of the pad layer 104 removed. In the step of removing the pad layer 104, the use of phosphoric acid having a higher temperature may quickly remove the pad layer 104.

Next, after the pad layer 104 is removed, a doped region 114 may be formed in the substrate 100. The doped region 114 is, for example, a well region. The method of forming the doped region 114 is, for example, an ion implantation method. After the above shape modification treatment is performed on the isolation structures 108a, the openings 112 may have a larger top width, so that the shielding effect of the isolation structures 108a on the ion implantation process may be reduced.

Figure 1H:
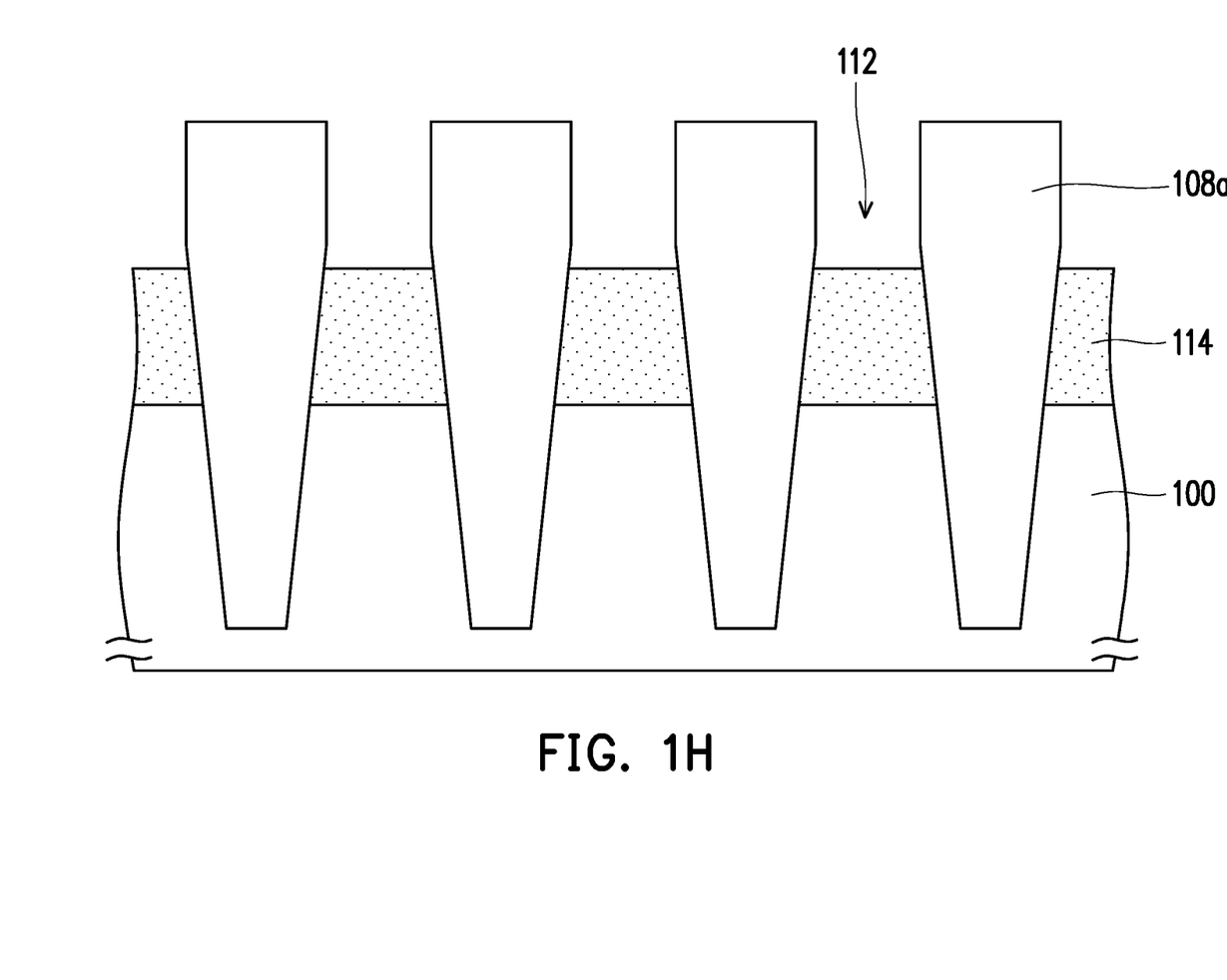

Referring to FIG. 1H, after the doped region 114 is formed, the pad layer 102 may be removed. Thereby, the openings 112 may expose the substrate 100. The method of removing the pad layer 102 is, for example, a wet etching method. When the material of the pad layer 102 is silicon oxide, the etchant used in the wet etching method may include hydrofluoric acid. In addition, in the process of removing the pad layer 102, a portion of the top and a portion of the side of the isolation structures 108a may be removed at the same time.

Figure 1I:
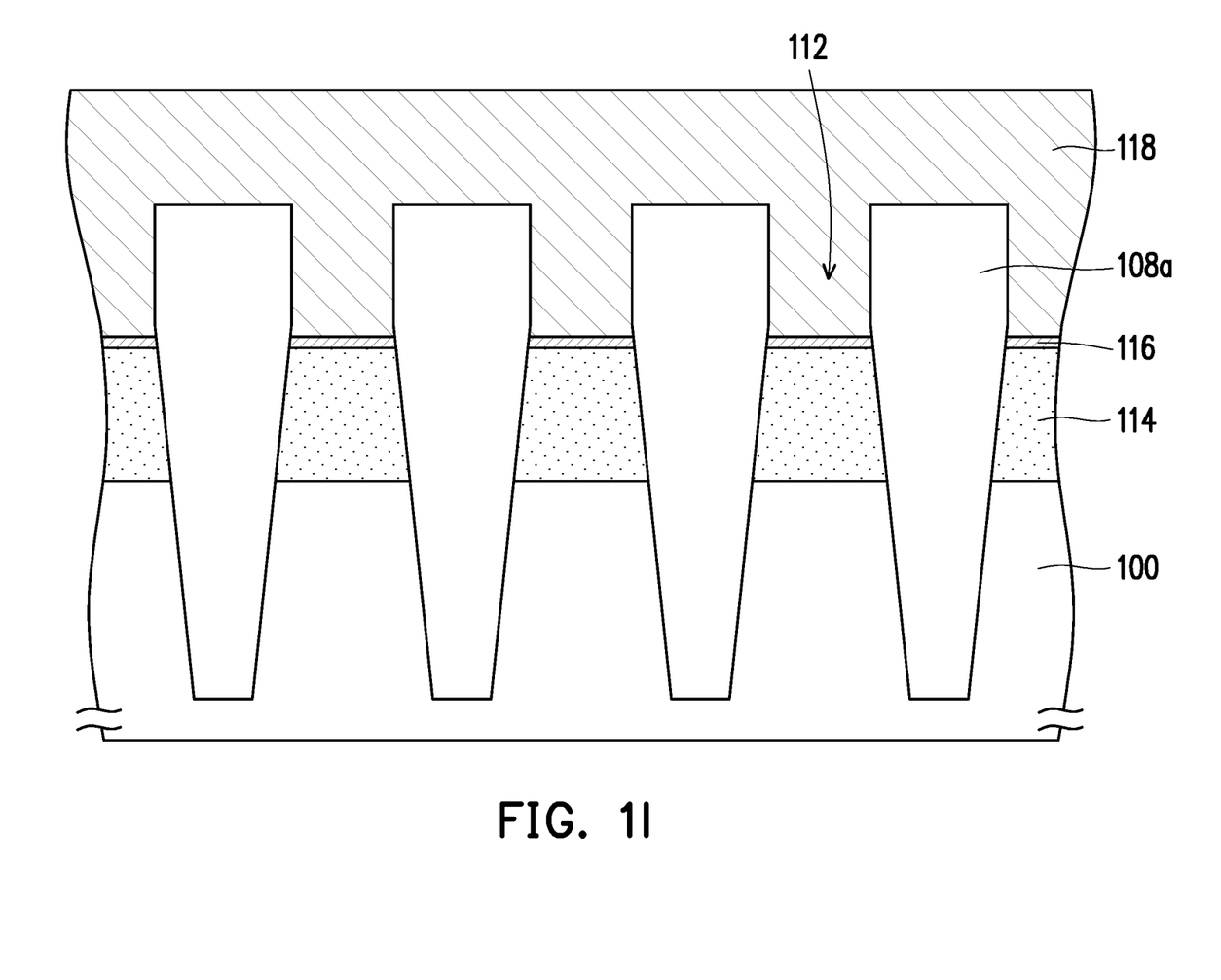

Referring to FIG. 1I, a dielectric layer 116 may be formed on the substrate 100 exposed by the openings 112. The dielectric layer 116 may be used as a tunneling dielectric layer. The material of the dielectric layer 116 is, for example, silicon oxide. The method of forming the dielectric layer 116 is, for example, a thermal oxidation method.

Then, a charge-storage material layer 118 filled in the openings 112 may be formed. The charge-storage material layer 118 may be located on the dielectric layer 116. The material of the charge-storage material layer 118 is, for example, doped polysilicon. The method of forming the charge-storage material layer 118 is, for example, a chemical vapor deposition method. After the shape modification treatment is performed on the isolation structures 108a, the openings 112 may have a larger top width, so that the gap-fill capability of the charge-storage material layer 118 formed in the openings 112 may be improved.

Figure 1J:
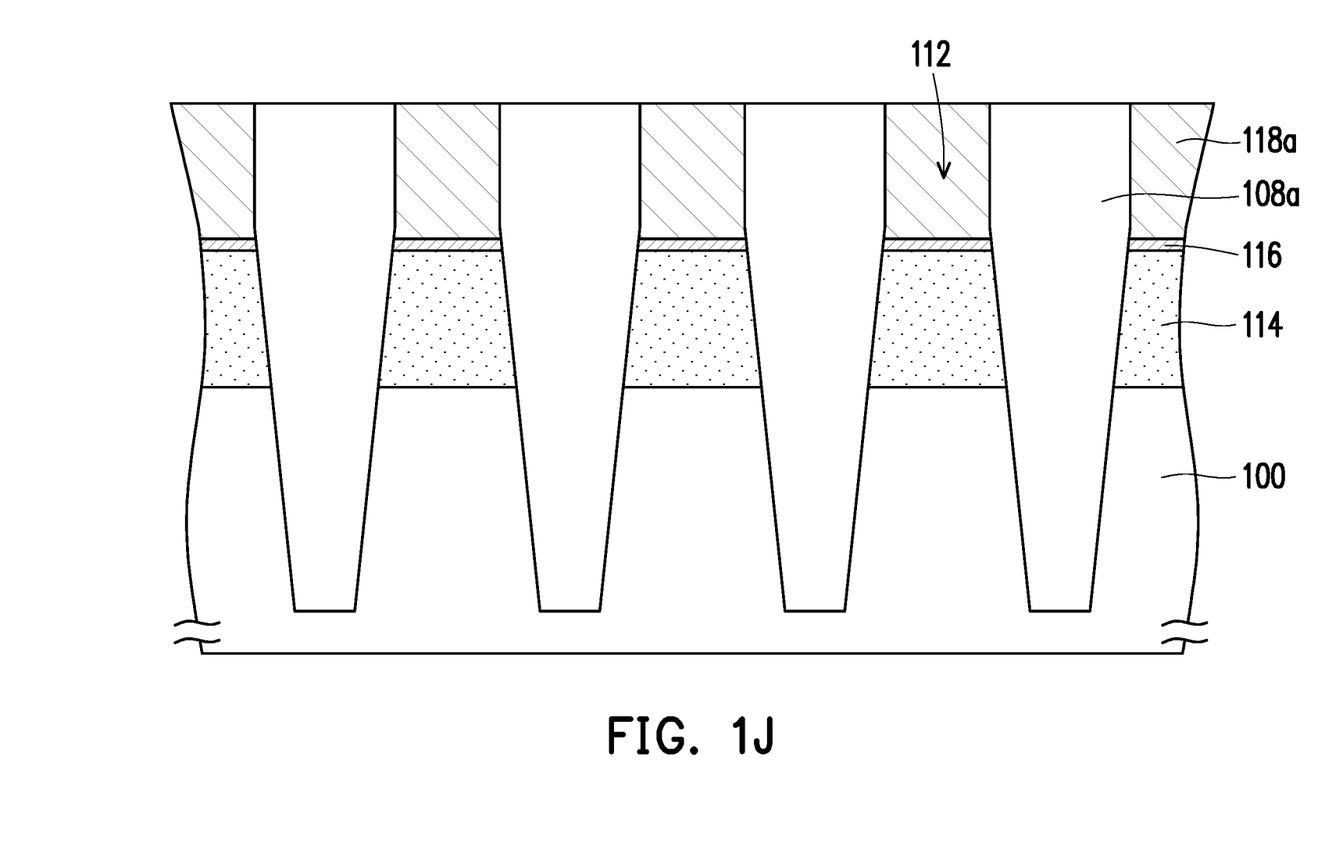

Referring to FIG. 1J, the charge-storage material layer 118 outside the openings 112 may be removed, and a charge-storage layer 118a is formed in the openings 112. The charge-storage layer 118a is, for example, a floating gate. The method of removing the charge-storage material layer 118 outside the openings 112 is, for example, a chemical mechanical polishing method. In the present embodiment, the method of forming the charge-storage layer 118a is exemplified by the above method, but the invention is not limited thereto.

Figure 1K:
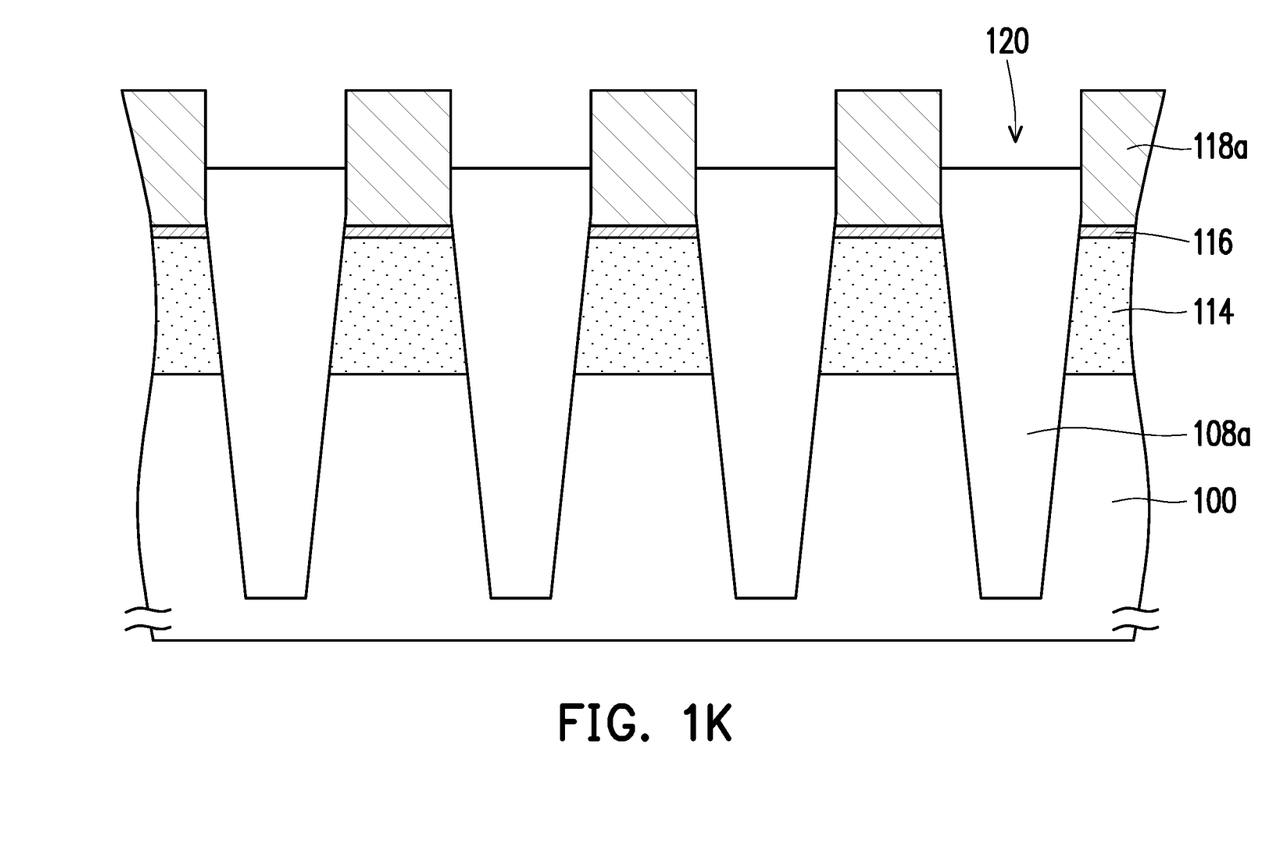

Referring to FIG. 1K, a portion of the isolation structures 108a may be removed, and a plurality of openings 120 are formed above the isolation structures 108a. The method of removing a portion of the isolation structures 108a includes a wet etching method, a dry etching method, or a combination thereof.

Figure 1L:
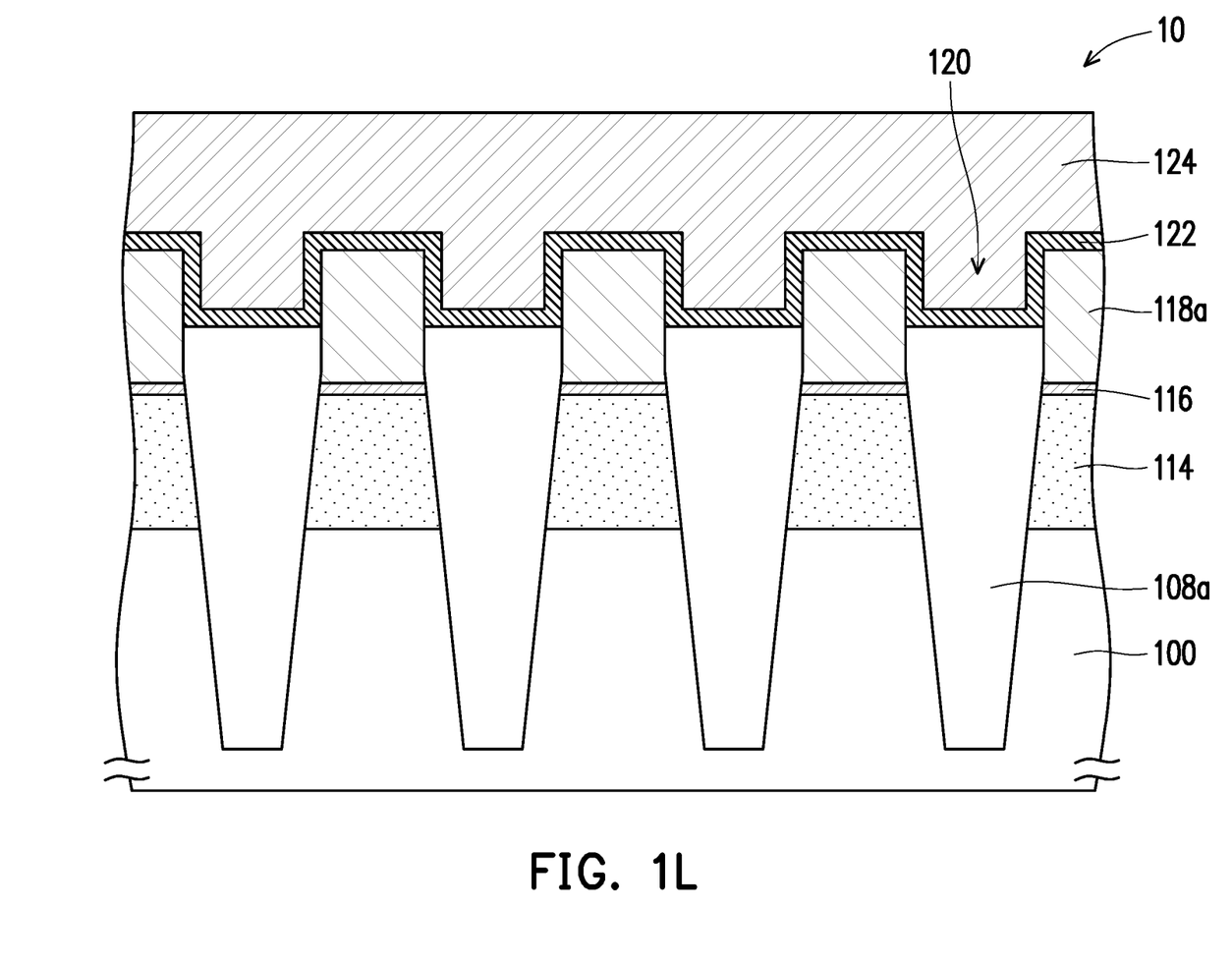

Referring to FIG. 1L, a dielectric layer 122 may be formed on the surface of the openings 120 and the charge-storage layer 118a. For example, the dielectric layer 122 may be a composite layer of silicon oxide layer/silicon nitride layer/silicon oxide layer (ONO). The method of forming the dielectric layer 122 is, for example, a chemical vapor deposition method or in-situ steam generation (ISSG).

Next, a conductive layer 124 may be formed on the dielectric layer 122. The conductive layer 124 is filled in the openings 120. The conductive layer 124 may be used as a control gate. The material of the conductive layer 124 is, for example, doped polysilicon. The method of forming the conductive layer 124 is, for example, a chemical vapor deposition method. As shown in FIG. 1B, since the angle θ between the bottom surface S1 of the pad layer 104 and the sidewalls S2 of the pad layer 104 may be less than 86 degrees, the isolation structures 108a may have a larger initial top width. In this way, even if the shape modification treatment causes the top width of the isolation structures 108a to be smaller, the isolation structures 108a may still have a sufficient top width. That is, the openings 120 formed subsequently may have a sufficient top width, such that the conductive layer 124 formed in the openings 120 has sufficient gap-fill capability.

Via the above method, a memory structure 10 may be formed. The memory structure 10 may be a non-volatile memory, such as an embedded flash (eFlash) memory. In some embodiments, the substrate 100 may include a memory device region and a logic device region. The memory structure 10 may be located in the memory device region. The isolation structures 108a in the memory device region and the isolation structures (not shown) in the logic device region may be formed at the same time.

Based on the above embodiments, it may be seen that in the method of manufacturing the memory structure 10, a shape modification treatment is performed on the isolation structures 108a to modify the sidewall shape of the isolation structures 108a, thereby allowing the openings 112 to have a larger top width. Since the openings 112 have a larger top width, the gap-fill capability of the charge-storage layer 118a formed in the openings 112 may be improved. In addition, in the subsequent ion implantation process performed on the substrate 100 below the openings 112, the shielding effect of the isolation structures 108a on the ion implantation process may be reduced.

Based on the above, in the method of manufacturing the memory structure of the above embodiments, a shape modification treatment is performed on the isolation structures, so that the gap-fill capability of the charge-storage layer may be improved, and the shielding effect on the ion implantation process may be reduced.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A method of manufacturing a memory structure, comprising:
   forming a first pad layer on a substrate;
   forming a plurality of isolation structures in the first pad layer and the substrate;
   performing at least one shape modification treatment on the plurality of isolation structures, wherein each shape modification treatment comprises:
     performing a first etching process on the first pad layer to reduce a height of the first pad layer and forming a plurality of first openings exposing sidewalls of the plurality of isolation structures; and
     performing a second etching process on the plurality of isolation structures after the first etching process is performed to modify a shape of the sidewalls of the plurality of isolation structures exposed by the plurality of first openings; and
   removing the first pad layer and forming a second opening between two adjacent isolation structures.

2. The method of manufacturing the memory structure of claim 1, wherein a method of forming the plurality of isolation structures comprises:
   performing a patterning process on the first pad layer and the substrate and forming a plurality of trenches in the first pad layer and the substrate;
   forming an isolation structure material layer filled in the plurality of trenches; and
   removing the isolation structure material layer outside the plurality of trenches.

3. The method of manufacturing the memory structure of claim 2, wherein after the patterning process is performed on the first pad layer, an angle between a bottom surface of the first pad layer and sidewalls of the first pad layer is less than 86 degrees.

4. The method of manufacturing the memory structure of claim 2, wherein a method of forming the isolation structure material layer comprises a high aspect ratio gap-fill process or high-density plasma chemical vapor deposition.

5. The method of manufacturing the memory structure of claim 1, wherein the first etching process comprises a wet etching process, and a method of removing the first pad layer comprises a wet etching method.

6. The method of manufacturing the memory structure of claim 5, wherein a material of the first pad layer comprises silicon nitride, an etchant used in the first etching process comprises a phosphoric acid, an etchant used to remove the first pad layer comprises a phosphoric acid, and a temperature of the phosphoric acid used to remove the first pad layer is higher than a temperature of the phosphoric acid used in the first etching process.

7. The method of manufacturing the memory structure of claim 1, wherein a top width of the plurality of first openings is enlarged by the second etching process.

8. The method of manufacturing the memory structure of claim 1, wherein the second etching process comprises a wet etching process.

9. The method of manufacturing the memory structure of claim 8, wherein a material of the plurality of isolation structures comprises silicon oxide, and an etchant used in the second etching process comprises diluted hydrofluoric acid.

10. The method of manufacturing the memory structure of claim 1, wherein a total height of the first pad layer reduced by the at least one shape modification treatment is less than half of an initial height of the first pad layer.

11. The method of manufacturing the memory structure of claim 1, further comprising:
    performing a cleaning process on the first pad layer before the at least one shape modification treatment is performed.

12. The method of manufacturing the memory structure of claim 11, wherein a cleaning solution used in the cleaning process comprises diluted hydrofluoric acid.

13. The method of manufacturing the memory structure of claim 1, further comprising:
    forming a second pad layer on the substrate before the first pad layer is formed, wherein a material of the second pad layer comprises silicon oxide.

14. The method of manufacturing the memory structure of claim 13, further comprising:
    forming a doped region in the substrate after the first pad layer is removed; and
    removing the second pad layer after the doped region is formed.

15. The method of manufacturing the memory structure of claim 1, further comprising:
    forming a charge-storage layer in the second openings.

16. The method of manufacturing the memory structure of claim 15, wherein the charge-storage layer comprises a floating gate.

17. The method of manufacturing the memory structure of claim 15, wherein a method of forming the charge-storage layer comprises:
    forming a charge-storage material layer filled in the second openings; and
    removing the charge-storage material layer outside the second openings.

18. The method of manufacturing the memory structure of claim 15, further comprising:
    forming a first dielectric layer on the substrate exposed by the second openings before the charge-storage layer is formed.

19. The method of manufacturing the memory structure of claim 15, further comprising:
    removing a portion of the plurality of isolation structures and forming a plurality of third openings above the plurality of isolation structures;

forming a second dielectric layer on surfaces of the plurality of third openings and the charge-storage layer; and forming a conductive layer on the second dielectric layer, wherein the conductive layer is filled in the plurality of third openings.

20. The method of manufacturing the memory structure of claim 1, wherein the substrate comprises a memory device region and a logic device region, the memory structure is located in the memory device region, and the plurality of isolation structures in the memory device region and the plurality of isolation structures in the logic device region are formed at the same time.

\* \* \* \* \*